United States Patent
Gupta et al.

[11] Patent Number: 6,020,035
[45] Date of Patent: *Feb. 1, 2000

[54] FILM TO TIE UP LOOSE FLUORINE IN THE CHAMBER AFTER A CLEAN PROCESS

[75] Inventors: Anand Gupta, San Jose; Mohan Bhan, Cupertino; Sudhakar Subrahmanyam, Sunnyvale, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/740,381

[22] Filed: Oct. 29, 1996

[51] Int. Cl.7 .............................. B05D 3/06; H05H 1/02; B08B 5/00

[52] U.S. Cl. .......................... 427/534; 427/579; 427/535; 427/574; 216/67; 438/905; 134/1.1

[58] Field of Search ...................................... 427/534, 535, 427/539, 563, 574, 579; 156/643.1; 216/67; 134/1.1; 438/788, 710, 789, 723, 905

[56] References Cited

U.S. PATENT DOCUMENTS

| | | | |
|---|---|---|---|
| 4,837,185 | 6/1989 | Yau et al. | 427/579 |
| 4,960,488 | 10/1990 | Law et al. | 204/298.33 |
| 5,011,705 | 4/1991 | Tanaka | 427/534 |
| 5,040,046 | 8/1991 | Chhabra et al. | 427/579 |
| 5,041,311 | 8/1991 | Tsukune et al. | 427/579 |
| 5,045,346 | 9/1991 | Tabasky et al. | 427/579 |
| 5,129,958 | 7/1992 | Nagashima et al. | 134/22.1 |
| 5,201,990 | 4/1993 | Chang et al. | 427/576 |
| 5,221,414 | 6/1993 | Langley et al. | 427/534 |
| 5,244,730 | 9/1993 | Nguyen et al. | 427/490 |
| 5,304,405 | 4/1994 | Kobayashi et al. | 427/534 |
| 5,366,585 | 11/1994 | Robertson et al. | 156/643.1 |
| 5,429,995 | 7/1995 | Nishiyama et al. | 427/579 |
| 5,431,964 | 7/1995 | Rivoire | 427/569 |
| 5,571,571 | 11/1996 | Musaka et al. | 427/579 |
| 5,589,233 | 12/1996 | Law et al. | 427/579 |
| 5,614,055 | 3/1997 | Fairbairn et al. | 156/345 |
| 5,824,375 | 10/1998 | Gupta | 427/534 |

FOREIGN PATENT DOCUMENTS

| | | |
|---|---|---|
| 58-92217 | 6/1983 | Japan . |
| 58-92218 | 6/1983 | Japan . |

*Primary Examiner*—Marianne Padgett
*Attorney, Agent, or Firm*—Townsend & Townsend & Crew

[57] ABSTRACT

An improved method of reducing the level of contaminants (e.g., fluorine) absorbed in films deposited within a substrate processing chamber. A seasoning layer is deposited within the substrate processing chamber to cover contaminants that may be absorbed within walls or insulation areas of the chamber interior. The deposited seasoning layer is more stable than prior art seasoning layers and is thus less likely to release the absorbed contaminants into the substrate processing chamber during the subsequent deposition of films. In a preferred embodiment, the seasoning layer is formed from a mixed frequency PECVD process in which the low frequency RF signal is supplied at a high power level to increase ion bombardment and enhance film stability. The increased bombardment favors the formation of stable SiF bonds between silicon and fluorine atoms in the lattice structure of the film rather than unstable $SiF_2$ or other bonds. When residual fluorine atoms (e.g., fluorine atoms absorbed within the chamber walls) are incorporated into the deposited seasoning layer, fewer loosely bonded fluorine atoms are incorporated into the layer than in prior art silicon oxide seasoning layers. Fewer loosely bonded fluorine atoms in the seasoning film results in fewer contaminants being incorporated into films deposited over substrates in subsequent processing steps.

20 Claims, 12 Drawing Sheets

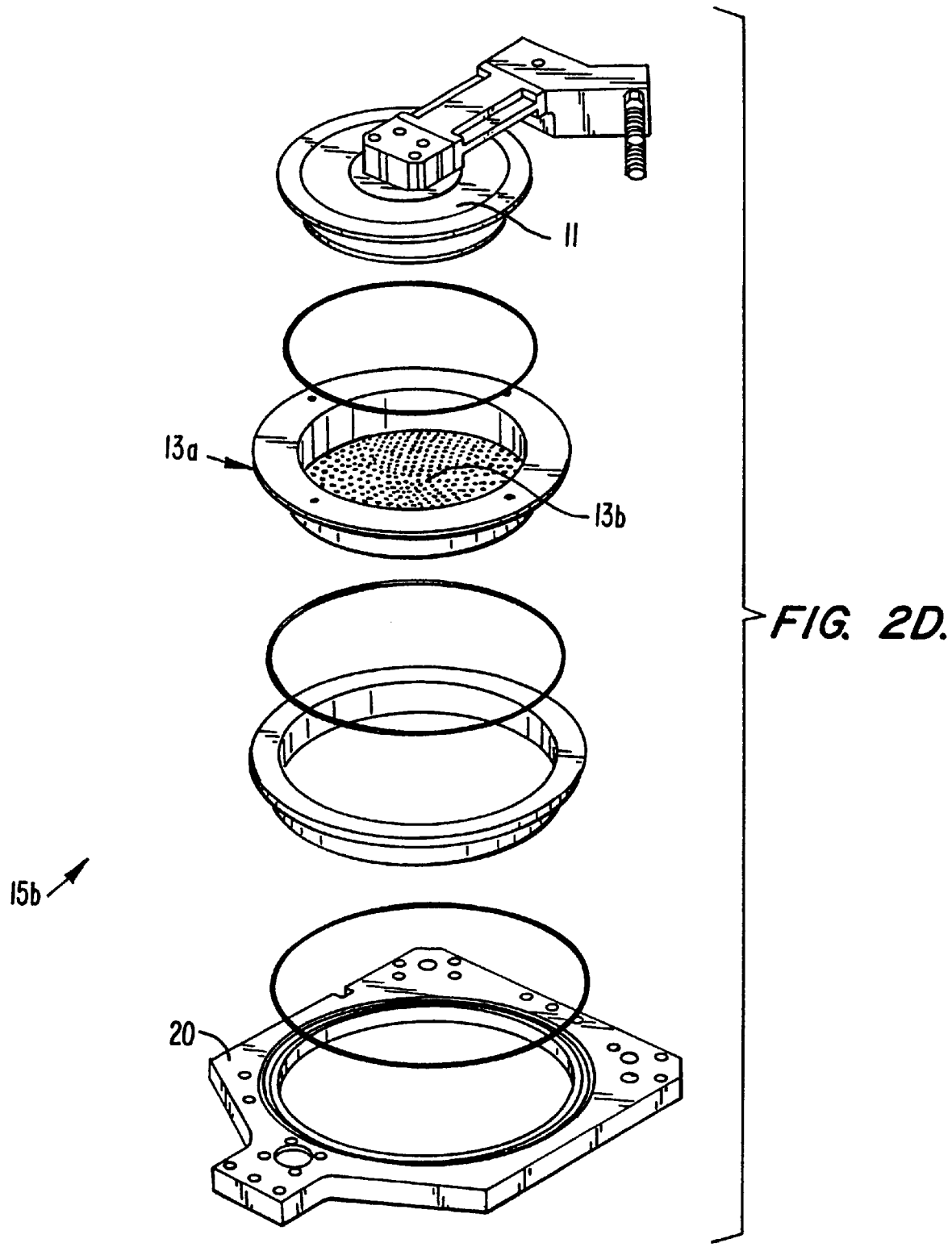

FILM TO TIE UP LOOSE FLUORINE IN THE CHAMBER AFTER A CLEAN PROCESS

BACKGROUND OF THE INVENTION

The present invention relates to the fabrication of integrated circuits. More particularly, the invention provides a technique, including a method and apparatus, for improving the quality of films deposited in a substrate processing chamber. The present invention is particularly useful for improving the quality of undoped silicon oxide films deposited by chemical vapor deposition processing, but may also be applied to other types of films (e.g., fluorsilicate glass [FSG] films) and to films deposited by other deposition techniques.

One of the primary steps in the fabrication of modern semiconductor devices is the formation of a thin film on a semiconductor substrate by chemical reaction of gases. Conventional thermal CVD processes supply reactive gases to the substrate surface where heat-induced chemical reactions produce a desired film. Another CVD method of depositing layers includes plasma enhanced CVD (PECVD) techniques. Plasma CVD techniques promote excitation and/or dissociation of the reactant gases by the application of energy, such as radio frequency (RF) energy, to excite the reactant gases, thereby creating a plasma. The high reactivity of the species in the plasma reduces the energy required for a chemical reaction to take place, and thus lowers the required temperature for such CVD processes. The relatively low temperature of a PECVD process makes such processes ideal for the formation of insulating layers over deposited metal layers and for the formation of other insulating layers.

One particular application of thermal CVD and PECVD techniques is to deposit silicon oxide layers over a semiconductor substrate. Because of their relatively low dielectric constant and good gap-fill properties, silicon oxide layers, including undoped silicate glass (USG), fluorosilicate glass (FSG) and others, are commonly used as insulation layers between deposited metal lines.

One particular method of depositing a USG layer includes forming a plasma from a process gas that includes tetraethoxysilane (TEOS) and oxygen. An example of such a silicon oxide film is described in U.S. Pat. No. 5,000,113, entitled "Thermal CVD/PECVD Reactor and Use for Thermal Chemical Vapor Deposition of Silicon Oxide and In-Situ Multi-step Planarized Process," issued to Applied Materials, Inc., the assignee of the present invention.

During CVD of silicon oxide and other layers onto the surface of a substrate, the deposition gases released inside the processing chamber cause unwanted deposition on areas such as the walls of the processing chamber. Unless removed, this unwanted deposition is a source of contaminate particles that may interfere with subsequent processing steps and adversely effect wafer yield.

To avoid such problems, the inside surface of the chamber is regularly cleaned to remove the unwanted deposition material from the chamber walls and similar areas of the processing chamber. This procedure is performed as a standard chamber dry clean operation where an etchant gas, such as nitrogen trifluorine ($NF_3$), is used to remove (etch) the deposited material from the chamber walls and other areas. The etchant gas is introduced into the chamber and a plasma is formed so that the etchant gas reacts with and removes the deposited material from the chamber walls. Such cleaning procedures are commonly performed between deposition steps for every wafer or every n wafers.

The clean step can, in itself, be a source of particle accumulation, however. Fluorine from the clean plasma can be absorbed and/or trapped in the chamber walls and in other areas of the chamber such as areas that include ceramic lining or other insulation material. The trapped fluorine can be released during subsequent processing steps (e.g., by reacting with constituents from the plasma in a PECVD step) and can be absorbed in subsequently deposited silicon oxide or other layers.

To prevent such fluorine absorbtion, a CVD chamber is often "seasoned" after the dry clean operation. Such seasoning includes depositing a thin silicon oxide layer over the chamber walls before a substrate is introduced into the chamber. The deposited silicon oxide layer covers the absorbed fluorine reducing the likelihood that it will contaminate subsequent processing steps. After deposition of the seasoning layer is complete, the chamber is used for one to n substrate deposition steps before being cleaned by another clean operation as described above and then reseasoned.

During deposition of the seasoning layer, some of the absorbed fluorine reacts with the deposition gases and becomes bonded within the seasoning layer instead of being covered by the layer. This fluorine can then later be released from the seasoning layer during deposition of a silicon oxide or other layer over the substrate. When released during such a deposition step, the fluorine may become an unwanted contaminant that is absorbed in the deposited film. Thus, while the seasoning layer reduces the amount of fluorine absorbed into subsequently deposited films, it may not completely prevent fluorine from being absorbed into the deposited film. If maintained within acceptable levels, however, the released fluorine is not an unacceptable contaminate and should not reduce yield to unacceptable levels.

The amount of fluorine absorbed in a given layer depends in part on how many substrates are processed between each clean step. For example, if three substrates are processed between clean steps, the amount of fluorine absorbed in the layer deposited over the first substrate processed after the seasoning step may be greater than the amount of fluorine absorbed into the layer deposited over the second or third substrate processed. A x-ray photoelectron spectroscopy (XPS) graph showing the fluorine concentration in three such deposited films as a function of depth is shown in FIG. 1 to illustrate this effect. As shown in FIG. 1, the fluorine concentration in the silicon oxide layer deposited over the first substrate (line 2) is greater than the fluorine concentration of the silicon oxide layers deposited over the second and third substrates (lines 4 and 6, respectively).

In FIG. 1, a spike 8 near the silicon/silicon oxide interface of the first substrate indicates an even higher fluorine concentration at that interface than at the corresponding silicon/silicon oxide interfaces in the films deposited over the second and third substrates. It is believed that the high fluorine concentration in spike 8 is due to a certain amount of loosely bonded fluorine present in the seasoning layer. It is believed that this loosely bonded fluorine is released from the seasoning layer during the early portion of the deposition step (e.g. during formation of the plasma in a PECVD step) of the film deposited over the first substrate. It is further believed that areas of similar fluorine concentration are not present in the latter portion of the first film or in films deposited over subsequent substrates because much of the loosely bonded fluorine is no longer available for release during deposition of these films. It is also believed that the fluorine concentration in the area of spike 8 is a source of loosely bonded fluorine in the lattice structure of the film.

The loosely bonded fluorine atoms may result in the film having a tendency to absorb moisture. The absorbed moisture may increase the film's dielectric constant and can cause further problems when the film is exposed to a thermal process such as an anneal process. The high temperature of a thermal process can move the absorbed water molecules and loosely bonded fluorine atoms out of the oxide layer through metal or other subsequently deposited layers. The excursion of molecules and atoms in this manner is referred to as outgassing.

One particular method of forming a seasoning layer that has been used in the past includes introducing TEOS, oxygen and helium into the chamber and then forming a plasma from the introduced gases. When used in a resistively-heated DxZ chamber manufactured by Applied Materials, a recommended process for this seasoning layer includes introducing TEOS into the chamber at a rate of 800 mgm and combining it with helium carrier gas introduced at 560 sccm. Oxygen is introduced into the chamber at 840 sccm. A plasma is then formed by application of mixed frequency RF power. A high frequency component (13.56 MHz) is driven at 510 W, and a low frequency component (350 KHz) is driven at 130 W. The temperature of the chamber is kept at 400° C., the pressure is maintained at 5 torr and the distance between the susceptor and the manifold is set to 280 mils.

The above seasoning process has successfully reduced contamination from absorbed fluorine to acceptable levels in many different applications and allowed for the deposition of stable silicon oxide films for those applications. As semiconductor device geometries continue to decrease in size, however, improved contamination reduction techniques are required for some applications. For example, a process that reduces contaminants to acceptable levels for producing integrated circuits having 0.35 $\mu$m feature sizes may not be provide acceptable results for integrated circuits having 0.18 $\mu$m micron feature sizes.

Thus, as device sizes become smaller and integration density increases, new and improved methods of reducing contaminants are desirable. Accordingly, it is desirable to develop improved methods of preventing fluorine absorbed in interior walls and/or ceramic lining areas of a substrate processing chamber from becoming contaminants in a deposition step performed within the chamber and from reducing the yield of subsequent processing steps.

SUMMARY OF THE INVENTION

The present invention provides an improved method of reducing the level of contaminants (e.g., fluorine) absorbed in films deposited within a substrate processing chamber. According to the present invention, a seasoning layer is deposited within a substrate processing chamber to cover contaminants that may be absorbed within walls or insulation areas of the chamber interior. The deposited seasoning layer is more stable than prior art seasoning layers and is thus less likely to release the absorbed contaminants into the substrate processing chamber during the subsequent deposition of films.

In a preferred embodiment, the deposited seasoning layer is a stable silicon oxide film that is deposited after a fluorine clean operation. The layer is formed from a mixed frequency PECVD process that promotes increased ion bombardment to enhance film stability. The increased bombardment favors the formation of stable SiF bonds between silicon and fluorine atoms in the lattice structure of the film rather than unstable $SiF_2$ or other bonds. Thus, when residual fluorine atoms (e.g., fluorine atoms absorbed within the chamber walls) are incorporated into the film's lattice structure during deposition of the seasoning layer, fewer loosely bonded fluorine atoms are incorporated into the layer than in prior art silicon oxide seasoning layers used to cover such fluorine residue. In a most preferred embodiment, increased ion bombardment is achieved by increasing the power of a low frequency RF component.

BRIEF DESCRIPTION OF THE DRAWINGS

FIGS. 2C and 2D are exploded perspective view of parts of the CVD chamber depicted in FIG. 2A;

DETAILED DESCRIPTION OF THE PREFERRED EMBODIMENTS

I. Introduction

The present invention allows a substrate processing step to be employed to deposit an insulation layer, such as a silicon oxide film, that has a low level of background contaminants and that is suitable for use in the fabrication of integrated circuits having feature sizes as small as 0.25 microns or less. The present invention can be used to reduce contaminants in insulation layers deposited in CVD chambers of conventional design.

II. Exemplary CVD System

Figure 1:
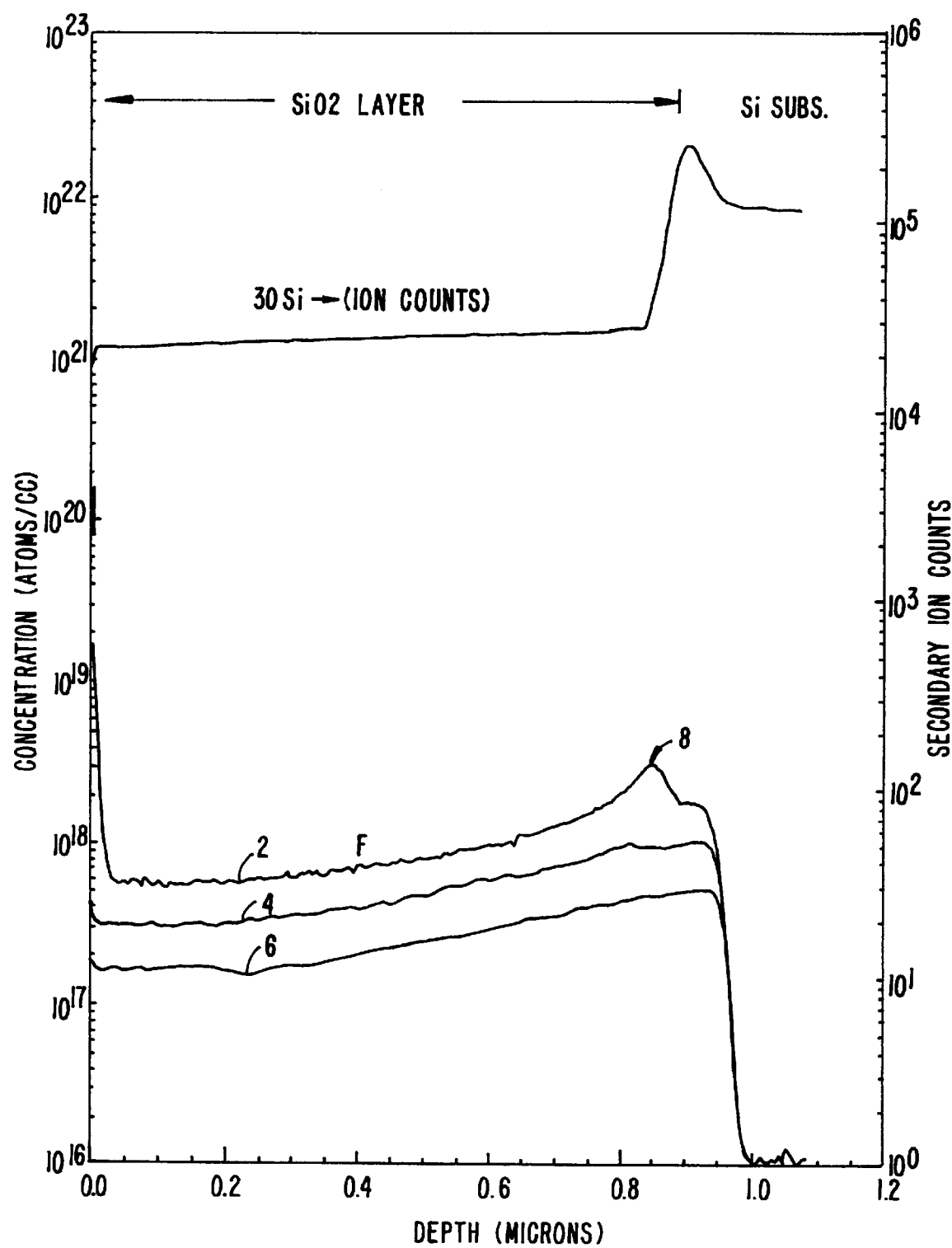
FIG. 1 is a graph showing an example of the amount of fluorine incorporated into silicon oxide films deposited in a chamber seasoned according to a prior art process.
Figure 2A:
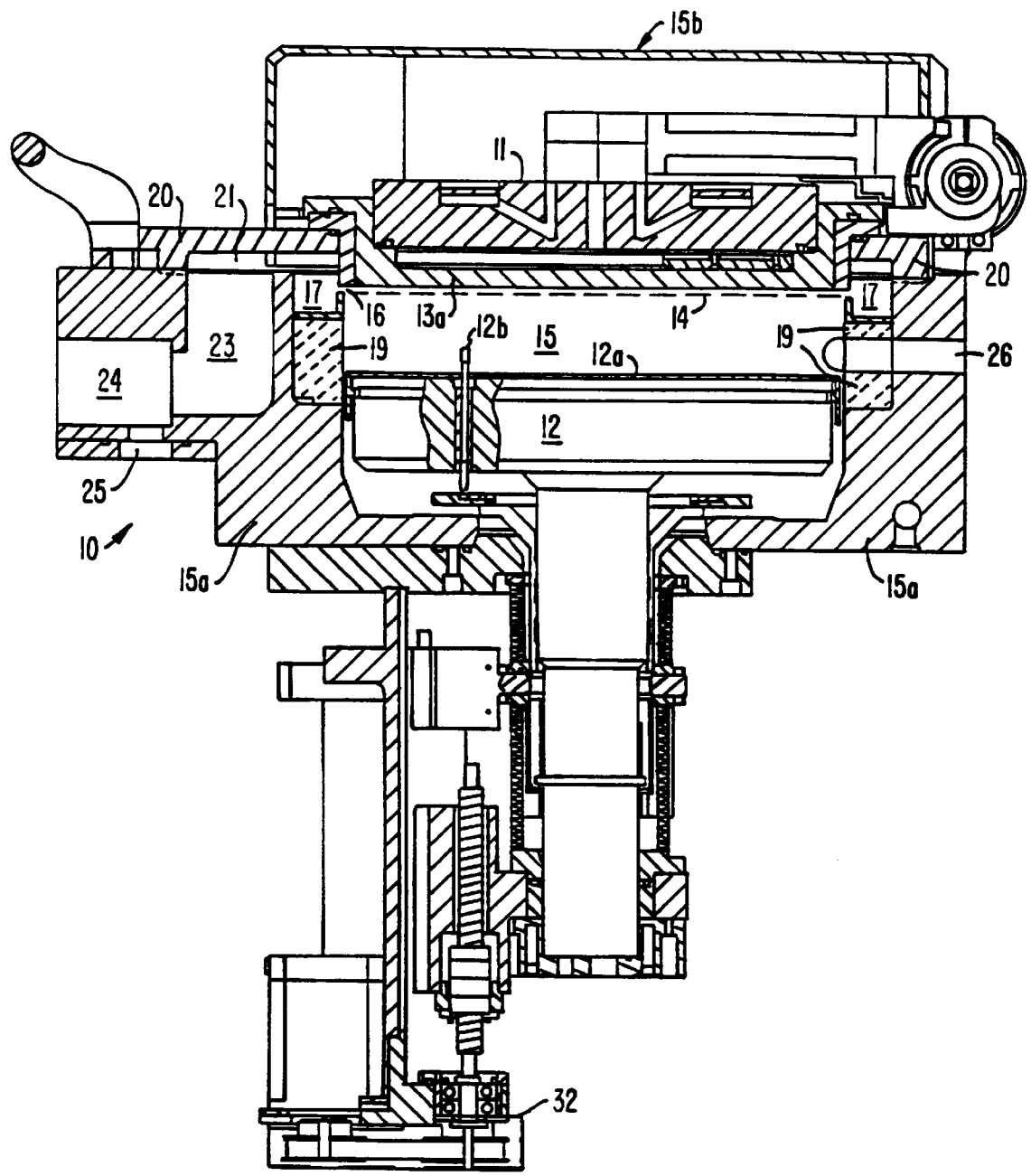
FIGS. 2A and 2B are vertical, cross-sectional view of one embodiment of a chemical vapor deposition apparatus according to the present invention.
Figure 2B:
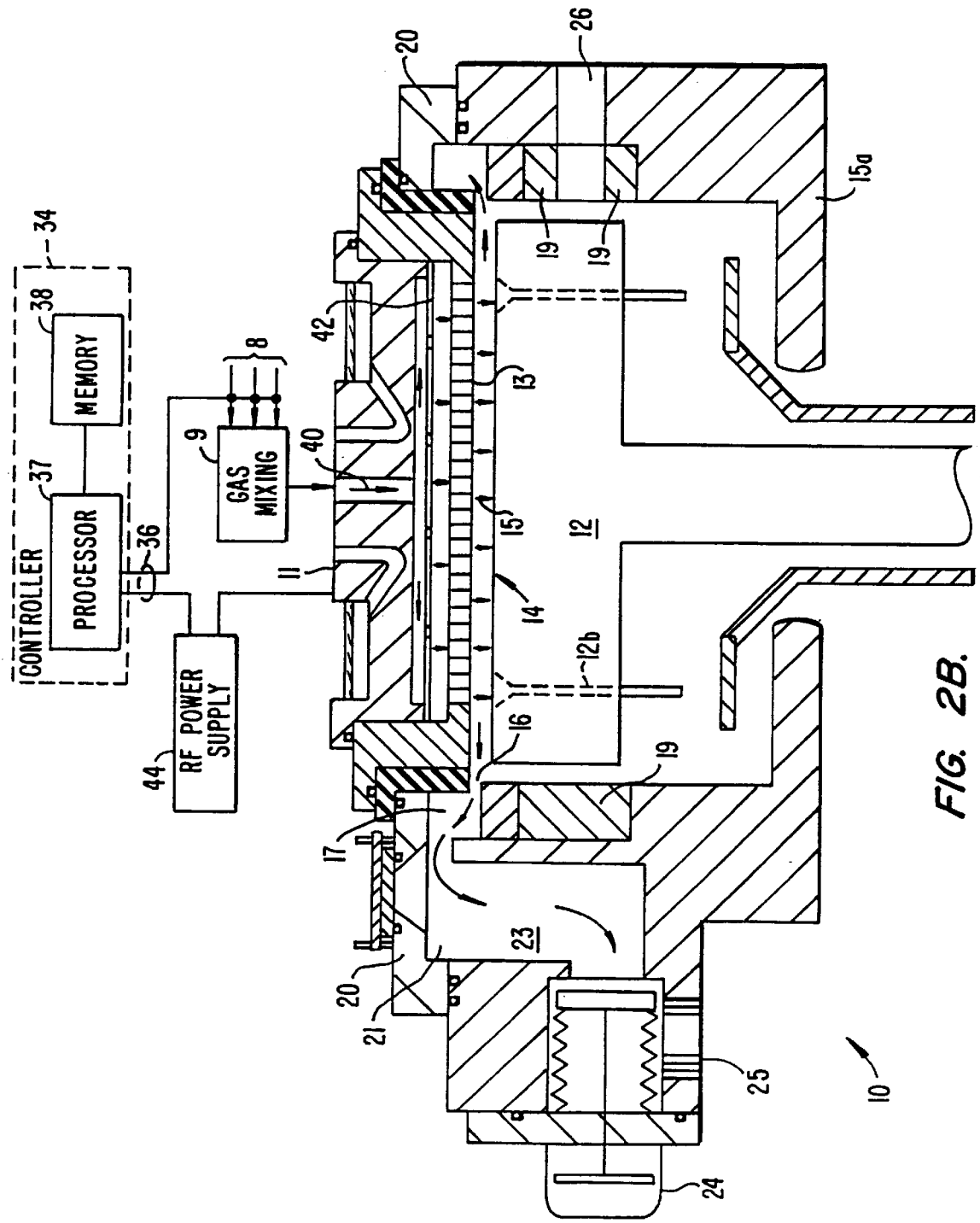
Figure 2C:
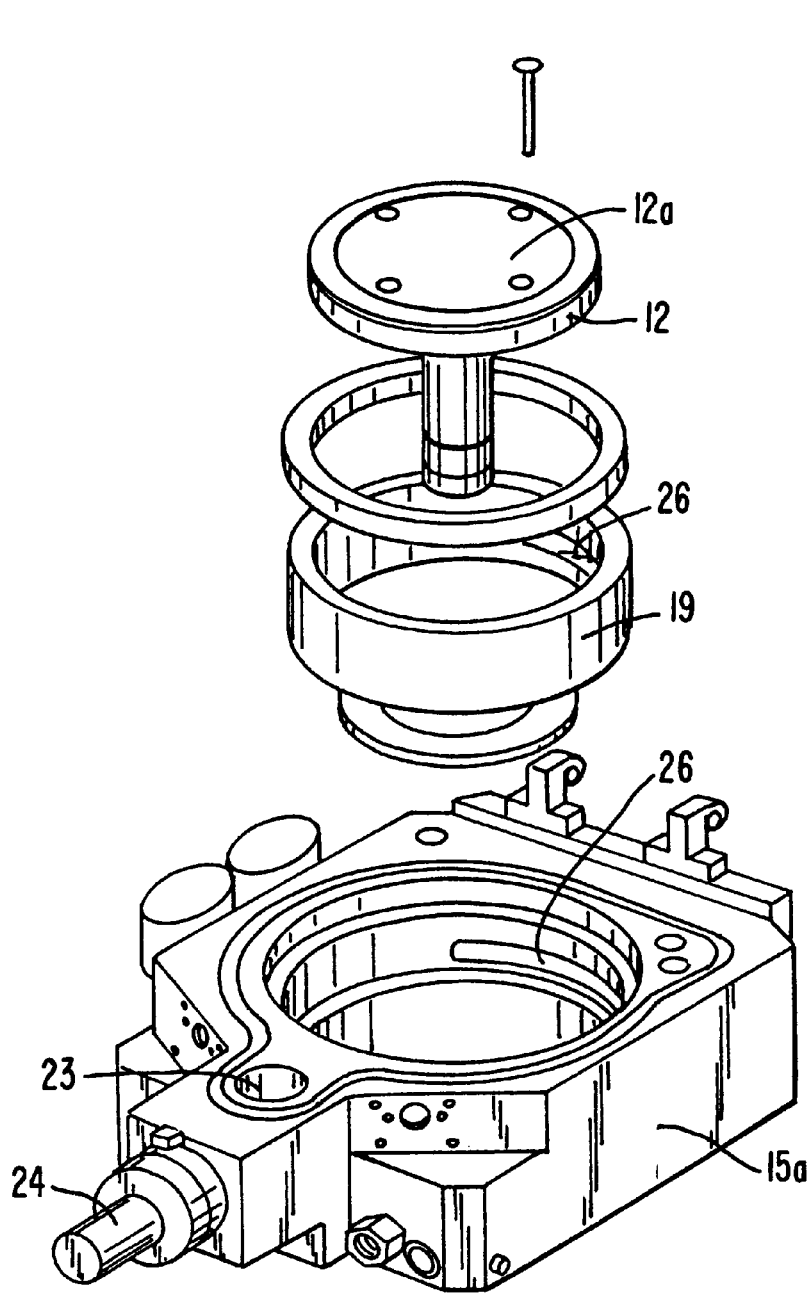

One suitable CVD machine in which the seasoning layer according to the present invention can be employed as shown in FIGS. 2A and 2B, which are vertical, cross-sectional views of a chemical vapor deposition system 10, having a vacuum or processing chamber 15 that includes a chamber wall 15a and chamber lid assembly 15b. Chamber wall 15a and chamber lid assembly 15b are shown in exploded, perspective views in FIGS. 2C and 2D.

Reactor 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be controllably moved between a lower loading/off-loading position (depicted in FIG. 2A) and an upper processing position (indicated by dashed line 14 in FIG. 2A and shown in FIG. 2B) which is closely adjacent to manifold 11. A centerboard (not shown) includes sensors for providing information on the position of the wafers.

Deposition and carrier gases are introduced into chamber 15 through perforated holes 13b (FIG. 2D) of a conventional flat, circular gas distribution face plate 13a. More specifically, deposition process gases flow into the chamber through the inlet manifold 11 (indicated by arrow 40 in FIG. 2B), through a conventional perforated blocker plate 42 and then through holes 13b in gas distribution faceplate 13a.

Before reaching the manifold, deposition and carrier gases are input through gas supply lines 8 into a mixing system 9 where they are combined and then sent to manifold 11. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma enhanced process. In a plasma enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls of the chamber body 15a surrounding the exhaust passageway 23 and the shutoff valve 24. When the plasma is not turned on, a hot liquid is circulated through the walls 15a of the process chamber to maintain the chamber at an elevated temperature. Fluids used to heat the chamber walls 15a include the typical fluid types, i.e., water based ethylene glycol or oil based thermal transfer fluids. This heating beneficially reduces or eliminates condensation of undesirable reactant products and improves the elimination of volatile products of the process gases and other contaminants which might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port 22, through a downward-extending gas passage 23, past a vacuum shut off valve 24 (whose body is integrated with the lower chamber wall 15a), and into the exhaust outlet 25 which connects to the external vacuum pump (not shown) through a foreline (also not shown).

The wafer support platter of the pedestal 12 (preferably aluminum) is heated using a double full turn single loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of the pedestal 12.

Typically, any or all of the chamber lining, gas inlet manifold faceplate, and various other reactor hardware is made out of material such as aluminum or anodized aluminum. An example of such a CVD apparatus is described in a U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 32 raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers 20 connected to supply lines 8, gas delivery system, throttle valve 32, RF power supply 44, and chamber and substrate heating systems are all controlled by a system controller 34 over control lines 36 of which only some are shown. Controller 34 relies on feedback from optical sensors to determine the position of moveable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single board computer (SBC), analog and digital input/output boards, interface boards and stepper motor controller boards. Various parts of CVD system 10 conform to the Versa Modular Europeans (VME) standard which defines board, card cage, and connector dimensions and types. The VME standard also defines the bus structure having a 16-bit data bus and 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate controller 34.

Figure 2E:
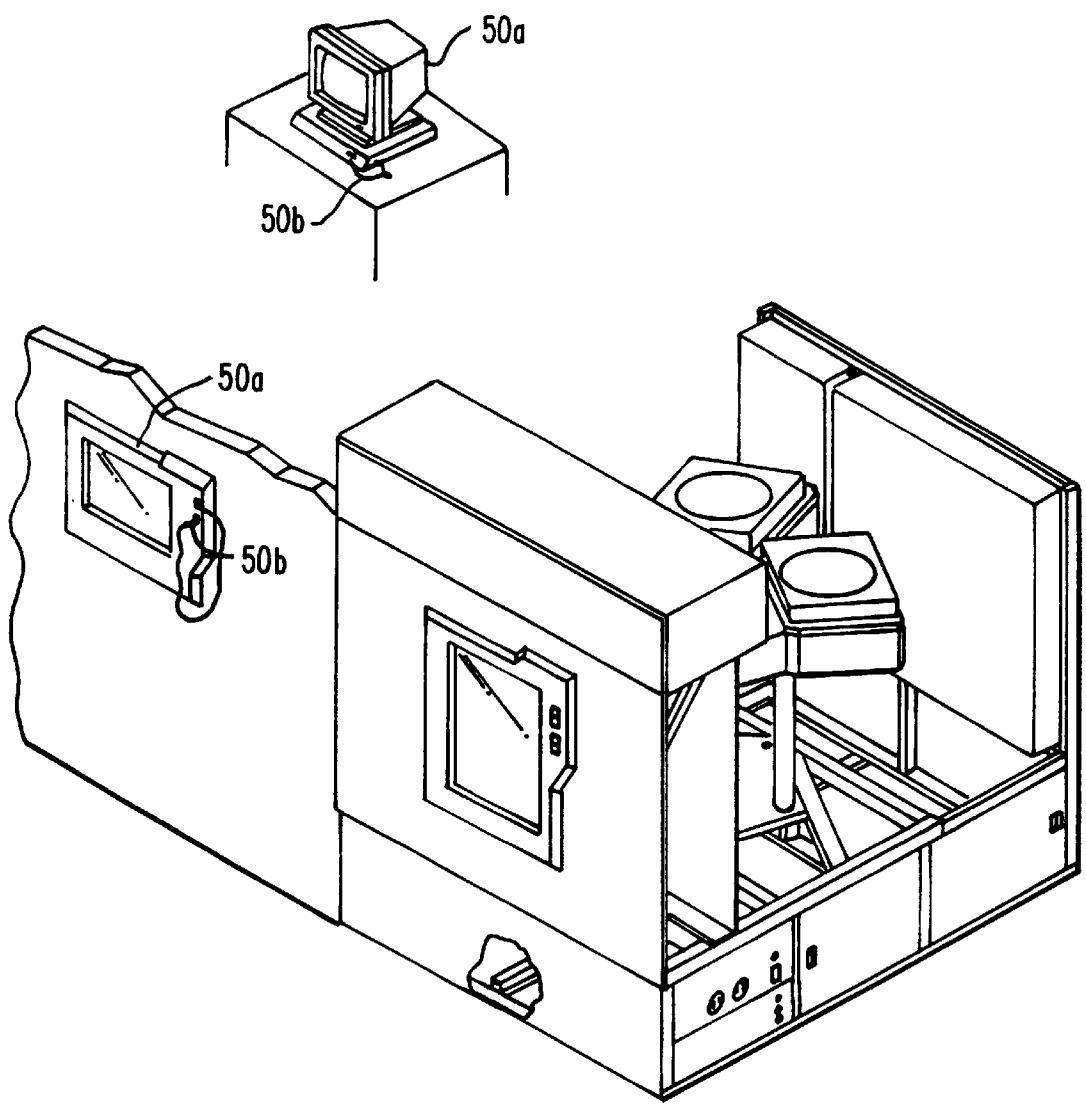
FIG. 2E is a simplified diagram of system monitor and CVD system 10 in a multi-chamber system, which may include one or more chambers.

The interface between a user and controller 34 is via a CRT monitor 50a and light pen 50b, shown in FIG. 2E, which is a simplified diagram of the system monitor and CVD system 10 in a multi-chamber system, which may include one or more chambers. In the preferred embodiment two monitors 50a are used, one mounted in the clean room wall for the operators and the other behind the wall for the service technicians. Both monitors 50a simultaneously display the same information, but only one light pen 50b is enabled. The light pen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the light pen and the display screen. Of course, other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language, such as, 68000 assembly language, C, C ++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 2F:
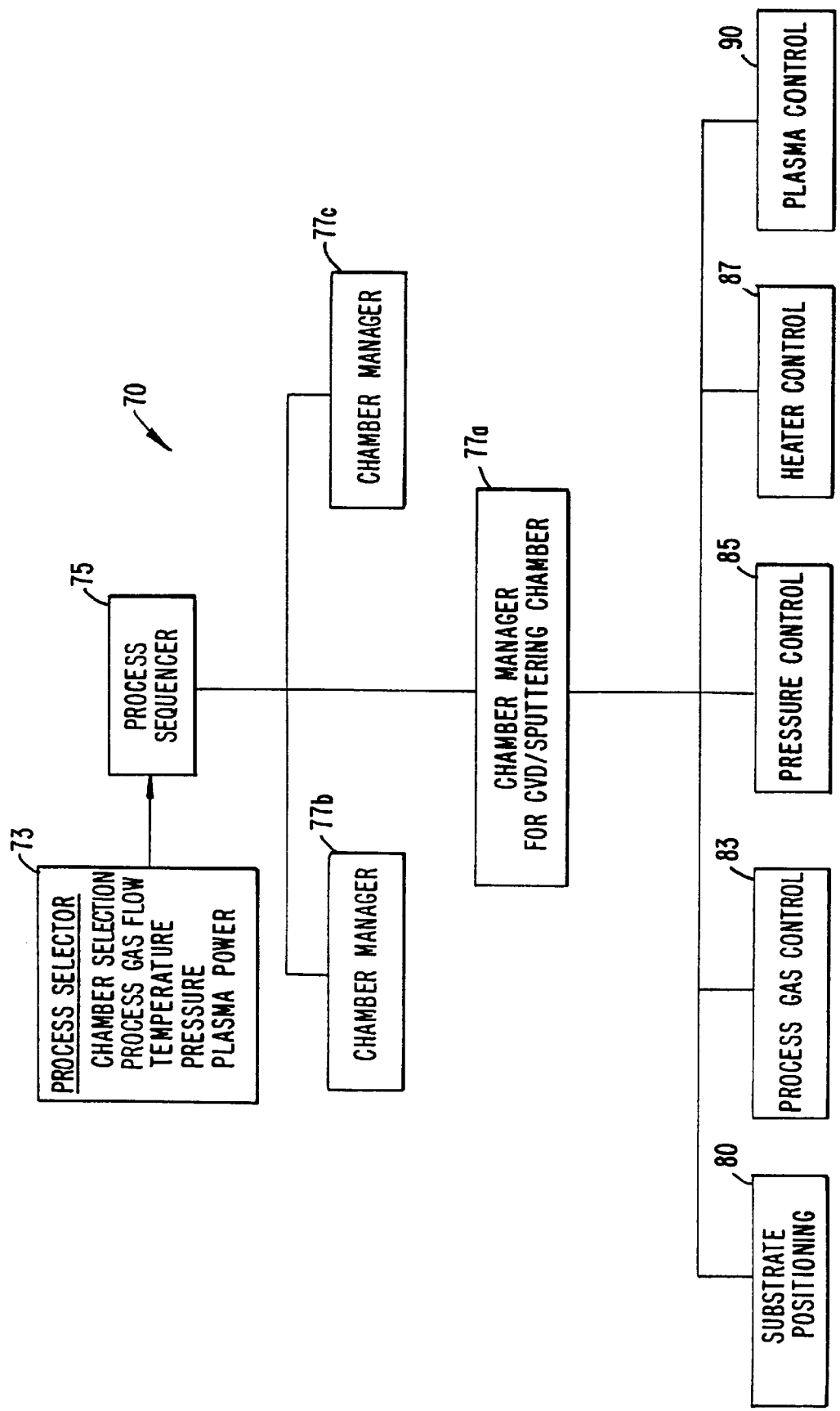
FIG. 2F shows an illustrative block diagram of the hierarchical control structure of the system control software, computer program 70, according to a specific embodiment.

FIG. 2F shows an illustrative block diagram of the hierarchical control structure of the system control software, computer program 70, according to a specific embodiment. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the light pen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the"age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2F. The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as helium or argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system 115 of the chamber. The size of the opening of the throttle valve is set to control the chamber pressure to the desired level in relation to the total process gas flow, size of the process chamber, and pumping setpoint pressure for the exhaust system 115. When the pressure control subroutine 85 is invoked, the desired, or target, pressure level is received as a parameter from the chamber manager subroutine 77a. The pressure control subroutine 147 operates to measure the pressure in the chamber 15 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to heating unit that is used to heat the substrate 20. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, compares the measured temperature to the setpoint temperature, and increases or decreases current applied to the heating unit to obtain the setpoint temperature. The temperature is obtained from the measured voltage by looking up the corresponding temperature in a stored conversion table, or by calculating the temperature using a fourth order polynomial. When an embedded loop is used to heat the susceptor 12, the heater control subroutine 87 gradually controls a ramp up/down of current applied to the loop. The gradual ramp up/down increases the life and reliability of the lamp. Additionally, a built-in fail-safe mode can be included to detect process safety compliance, and can shut down operation of the heating unit if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above described system such as variations in susceptor design, heater design, RF power frequencies, location of RF power connections and others are possible. For example, the wafer could be supported and heated by a quartz lamps. The seasoning layer of the present invention and method for forming such a layer is applicable to a variety of different substrate processing apparatuses and is not intended to be limited to the exemplary chamber just described.

III. Depositing Stable Halogen-doped Silicon Oxide Films

The present invention may be employed to reduce the amount of contaminants present during substrate processing that originate from walls or insulation areas in the interior of a substrate processing chamber, such as the exemplary chamber described. Contaminant reduction is obtained by depositing a silicon oxide seasoning layer over walls and insulation areas within the interior of the chamber that could otherwise be a source of such contaminants. The seasoning layer formed according to the present invention has higher stability than previous seasoning layers, which in turn enables improved contaminant reduction over these previous seasoning layers.

Figure 3:
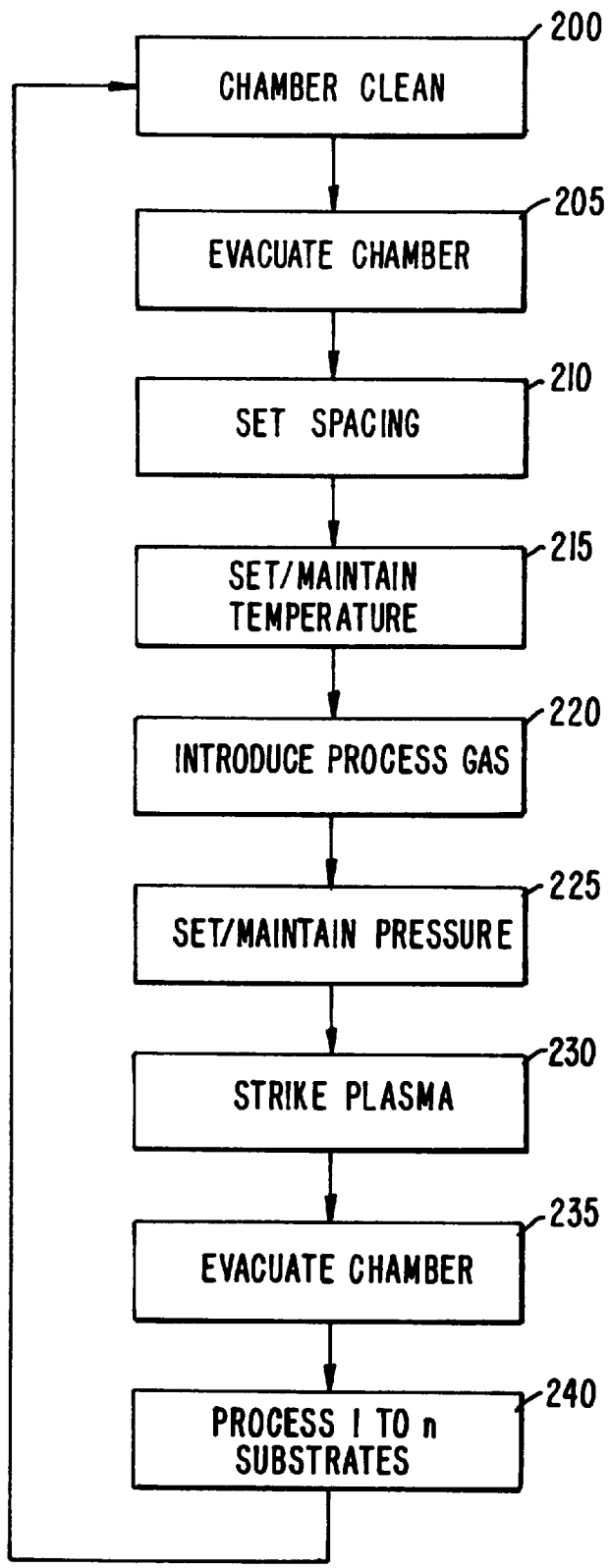
FIG. 3 is a flow chart illustrating process steps in the formation of a seasoning film according to an embodiment of the method of present invention.

FIG. 3 illustrates a preferred process of the invention with cross-reference numerals referring to the apparatus shown in FIG. 2A. This process is implemented and controlled using a computer program stored in the memory 38 of CVD system 10. In this preferred embodiment, the seasoning layer is deposited after completion of a standard chamber clean operation (step 200) in which an etchant gas such as $NF_3$ is introduced into the chamber to remove material deposited on the chamber walls from a previous deposition step (e.g., one of the deposition operations in step 240). The seasoning layer of the present invention covers at least a portion of the residue (e.g., fluorine absorbed within the chamber walls) such that the residue is not released during a subsequent deposition step (e.g., step 240). Additionally, a certain amount of fluorine from the residue that is not covered by the deposited seasoning layer is instead incorporated into that layer. As described in detail below, the process conditions of the preferred embodiment encourage formation of strong SiF bonds between silicon atoms in the deposited silicon oxide layer and fluorine atoms from the residue. These strong SiF bonds are less likely to release the incorporated fluorine from the seasoning layer during subsequent deposition steps within the chamber thereby reducing the level of contaminants in the deposition steps.

As shown in FIG. 3, the seasoning layer is deposited after completion of the clean step (step 200). In preparation for deposition of the seasoning layer, the chamber is evacuated (step 205), the distance between the susceptor and gas manifold is set to 240 mil (step 210) and the chamber is heated to a temperature of 400° C. (step 215). Next, a process gas that includes TEOS, oxygen and helium is introduced into the chamber (step 220). TEOS is introduced at a rate 915 mgm, vaporized and combined with a helium carrier gas flow introduced at 1000 sccm before being introduced into the chamber. Oxygen is introduced into the chamber at 600 sccm, and a second source of helium, separate from the TEOS carrier gas, is introduced at 1500 sccm. Pressure within the chamber is set and maintained at 4 torr (step 225).

After the deposition conditions are stabilized, a plasma is formed from the process gas to deposit the silicon oxide seasoning layer (step 230). The plasma is formed from mixed frequency RF power in which a high frequency RF component of 13.56 MHz is powered at 110 W and a low frequency RF component of 350 KHz is powered at 425 W (a power density of 3.98 W/in$^2$). For most applications, the plasma is maintained for about 15 to 60 seconds to deposit a seasoning layer of between about 1500 to 6000 Å. The length of the seasoning step depends in part on the amount of fluorine residue left in the chamber, which is in part dependent on the length of the clean step. Longer clean steps generally leave more fluorine contamination and residue and therefore generally require a thicker seasoning layer to adequately cover and incorporate into the layer substantially all the residual fluorine. For example, in one application, maintaining the plasma for about 30 seconds to deposit a seasoning layer about 5000 Å thick is adequate after a 140 second cleaning step. In another application, a 15 second deposition step that deposits a seasoning layer about 2500 Å thick is adequate after a 75 second clean that uses the same gases and parameters.

Upon formation of the plasma, the plasma reacts with fluorine that is absorbed in certain walls and insulation areas of the chamber interior. The reacted fluorine from the chamber interior is then excited into free fluorine radicals in the plasma which results in fluorine being incorporated into the seasoning layer as it is deposited. The power of the low frequency RF component used in the deposition of the seasoning layer according to the present invention is substantially higher than the low frequency RF power that was used in previous seasoning layers. The increase in power of the low frequency RF component, results in an increase in the amount of energy transferred to the oscillating free fluorine atoms in the plasma and enhanced ion bombardment of the seasoning layer as it is deposited. The energetic free fluorine that bombards the growing film is then incorporated into the film as strong and stable SiF bonds rather than less stable SiF$_2$ or other bonds. Because more of the incorporated fluorine is in the form of stable SiF bonds, the incorporated fluorine is less likely to react with deposition gases introduced to deposit subsequent layers during substrate processing in step 240 and is less likely to contaminate such subsequent processing.

In other embodiments, the low frequency RF component can be less than 425 W. It is preferable, however, that the low frequency RF power provide a power density of at least 2.65 W/in$^2$ (300 W applied to the 12-inch diameter faceplate used in a D×Z chamber manufactured by Applied Materials, Inc. and outfitted for 8-inch wafers), and more preferably, a power density of at least 3.10 W/in$^2$ (350 W). Depending on the substrate processing chamber used, it is preferable that the low frequency RF power not be too high. For example, if the power is above 800 W on the D×Z chamber, impedance matching problems may occur that could result in high reflected power that adversely effects the plasma stability.

In addition to the higher low frequency RF component, other deposition parameters also differ in the preferred embodiment as compared to previous seasoning layers to help ensure stability of the seasoning film and trap residual fluorine within the film in the form of strong SiF bonds. For example, in the preferred embodiment of the present invention, chamber pressure is set to 4 torr rather than the 5 torr used to deposit the prior art seasoning layer. The decrease in pressure results in more ion bombardment during deposition of the layer thereby increasing the energy of the reaction and further favoring the formation of strong SiF bonds rather than weaker SiF$_2$ bonds. Also, the distance between the susceptor and manifold in the preferred embodiment is only 240 mil rather than 280 mil. This decrease in distance also increases the ion bombardment during deposition thereby promoting strong SiF bonds in the deposited seasoning layer. Additionally, an increased helium flow is introduced into the chamber. It is believed that the increased flow helps stabilize the plasma, which also favors formation of stable SiF bonds.

Figure 4:
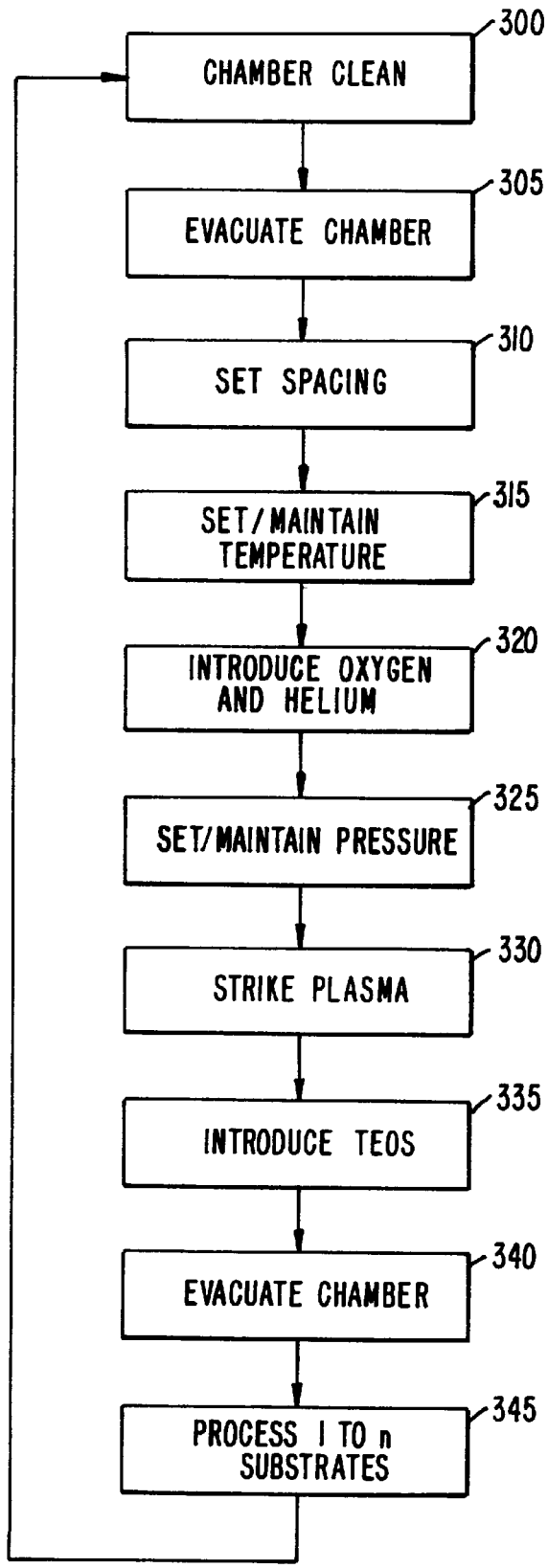
FIG. 4 is a flow chart illustrating process steps in the formation of a seasoning film according to another embodiment of the present invention.

Another embodiment of the present invention is shown in the flowchart of FIG. 4. In FIG. 4, steps 300 to 315 are identical to steps 200 to 215 described with respect to FIG. 3. In step 320, however, oxygen and helium are first introduced to the chamber without TEOS and the pressure is set and maintained in step 325. A plasma is then formed from this process gas (step 330) and maintained for about 5 seconds. The plasma reacts with fluorine atoms absorbed in the chamber walls to release those atoms from the walls. This generates free fluorine radicals in the plasma before any of the seasoning layer is deposited. Next, TEOS is introduced into the chamber along with the helium carrier gas to effect deposition of the silicon oxide seasoning layer (step 335). The plasma is maintained during this step and the released fluorine is incorporated into the growing oxide layer. The remaining steps (steps 340 and 345) in this embodiment are similar to steps 235 and 240 in the embodiment described with respect to FIG. 3.

Seasoning layers deposited according to the present invention exhibit a compressive stress level of between 3×10$^{-9}$ dynes/cm$^2$ and 0.7×10$^{-9}$ dynes/cm$^2$. Preferably, the stress level is about 1×10$^{-9}$ dynes/cm$^2$ compressive. The deposition rate of the films is generally between 5000 Å/min and 15000 Å/min. Higher deposition rates are created by introducing the process gases, namely TEOS, at increased rates and increasing the high frequency RF power to ensure adequate break-up of the additional TEOS.

The above-described gas introduction rates are based on forming a seasoning layer of the present invention in a resistively heated D×Z DCVD chamber manufactured by Applied Materials that has a volume of approximately 5.9 liters and that is outfitted for 8-inch wafers. As a person of ordinary skill in the art would understand, the actual rates at which gases are introduced in other embodiments will vary if other chambers of different designs and/or volume are employed.

IV. Test Results and Measurements:

To show the effectiveness of the present invention, experiments were performed depositing various seasoning layers with and without the benefits of the method of the present invention. The experiments were performed in a resistively-heated DxZ chamber manufactured by Applied Materials. The DxZ chamber was outfitted for 200-mm wafers and situated in a P5000 substrate processing system also manufactured by Applied Materials.

In the experiments, two different seasoning layers were deposited using the parameters listed in Table 1.

TABLE 1

SEASONING LAYER DEPOSITION EXPERIMENT

| Deposition Conditions | Substrate 1 | Substrate 2 |
|---|---|---|
| Temperature | 400° C. | 400° C. |
| Pressure | 5 torr | 4 torr |
| Spacing | 280 mil | 240 mil |
| RF1 (13.56 MHz) | 510 W | 110 W |
| RF2 (350 KHz) | 130 W | 425 W |
| TEOS | 800 mgm | 915 sccm |
| He Carrier | 560 sccm | 1000 sccm |
| $O_2$ | 840 sccm | 600 sccm |
| 2nd He | — | 1500 sccm |
| Dep. Rate | 7000 Å/min | 6500 Å/min |

The layers were deposited after the chamber was cleaned with an $NF_3$ clean step. Substrates were placed in the chamber during each seasoning layer deposition step and the films deposited over each substrate were evaluated and compared. The layer deposited over the first substrate was deposited according to a known method described earlier, while the layer deposited over the second substrate was deposited according to the method of the present invention. Thermal desorbtion spectra (TDS) data measured for each film as substrates were heated to 1050° C. shows that the second film has increased stability over the first film.

Figure 5A:
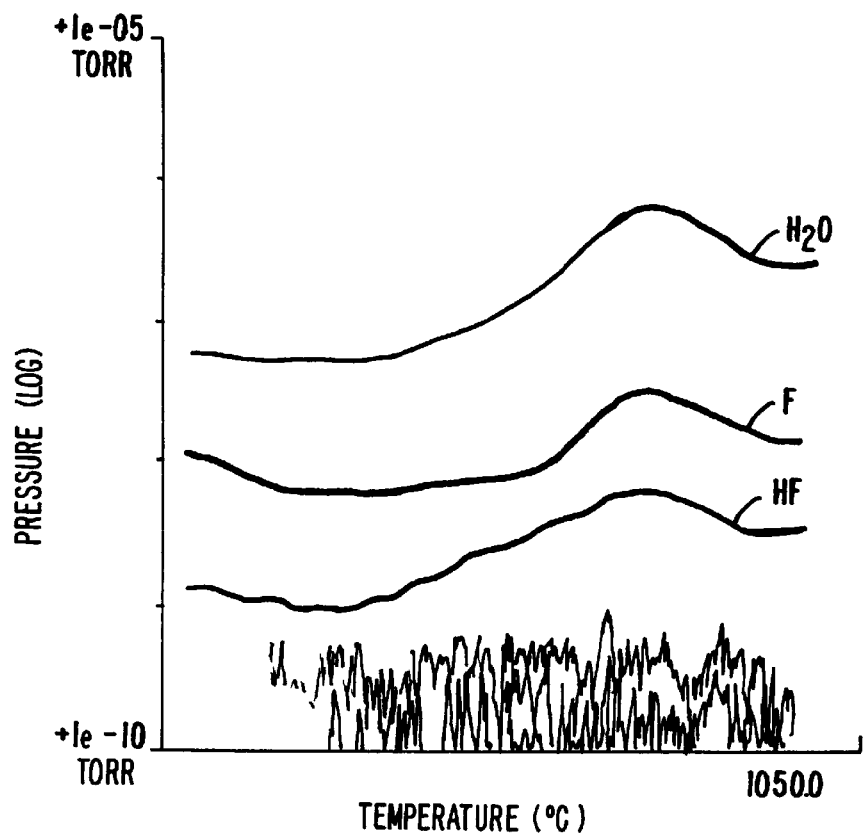
FIGS. 5A and 5B are thermal desorbtion spectra graphs comparing the outgassing of $H_2O$, HF and F in seasoning layer deposited with and without the benefits of the present invention.
Figure 5B:
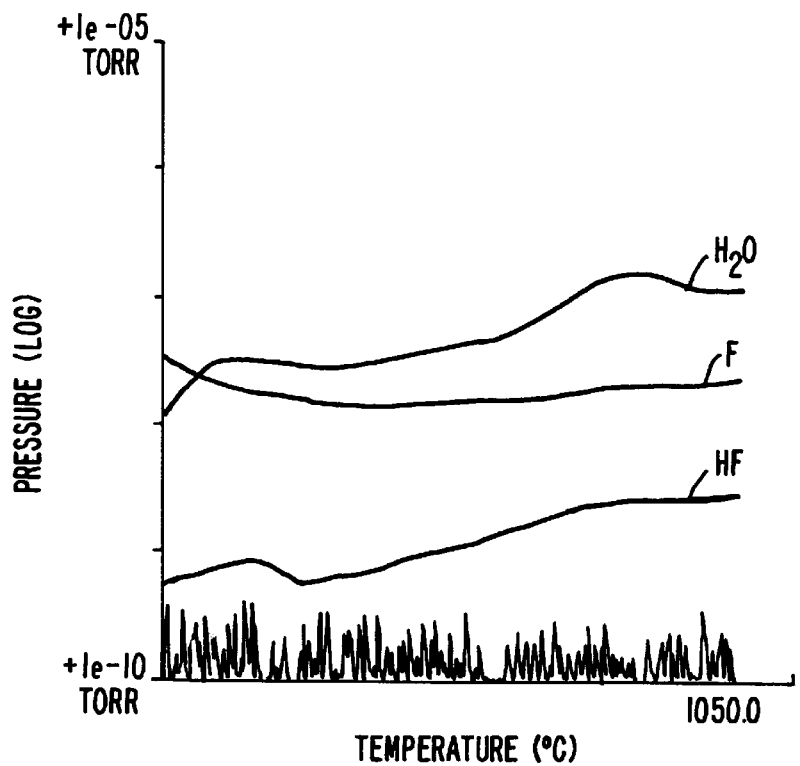

FIG. 5A is a graph showing TDS data measuring the out gassing of $H_2O$, F and HF from the seasoning layer deposited over the first substrate without the benefit of the present invention, and FIG. 5B is a graph of similar TDS data for the seasoning layer deposited over the second substrate with the benefit of the present invention.

As is known by those of skill in the art, the X-axis in each of FIGS. 5A and 5B represents the temperature of the substrate as it is heated from room temperature to a specified temperature (in these tests, approximately 1050° C.). Also, the absolute pressure measured includes contaminant levels of the measured gases. These contaminant levels may differ between tests. Thus, outgassing is determinable by examining changes in pressure as compassed to absolute pressure.

In FIG. 5A, it is evident that some F out gassing occurs starting at about 500° C. This out gassing is evidence of loosely bonded fluorine atoms in the seasoning film that could become contaminants during subsequent process steps. As evident in FIG. 5B, on the other hand, substantially no F out gassing occurs in the seasoning layer deposited according to the present invention at up to over 1000° C. This proves the seasoning layer is very stable and has few, if any, $SiF_2$ or other unstable fluorine bonds. In other embodiments, seasoning layers need not be stable all the way up to 1000° C., but it is preferable that seasoning layers according to the present invention are stable up to at least 600° C. Furthermore, a comparison of HF and $H_2O$ out gassing in FIG. 5A to that of FIG. 5B illustrates that the layer deposited over the second substrate is the more stable film.

In another experiment, a straight run of 1300 wafers was performed in a DxZ chamber to compare the seasoning process of the present invention to the prior art seasoning process previously described. In the experiment, the following sequence was repeated for each wafer: first, a low resistivity wafer was loaded into the deposition chamber and an FSG film was deposited over the wafer; next, the wafer was taken out of the chamber and the chamber was cleaned with a fluorine plasma; after completion of the clean operation, the chamber was seasoned. Each FSG deposition step deposited a 1 μm FSG layer over the wafer from a plasma of $SiF_4$, TEOS, $O_2$ and helium. In each clean step a plasma of $C_2F_6$, $NF_3$ and $O_2$ was formed for 70 seconds to remove substantially all deposition build-up within the chamber. Both the new and old seasoning steps were run for 10 seconds.

Figure 6:
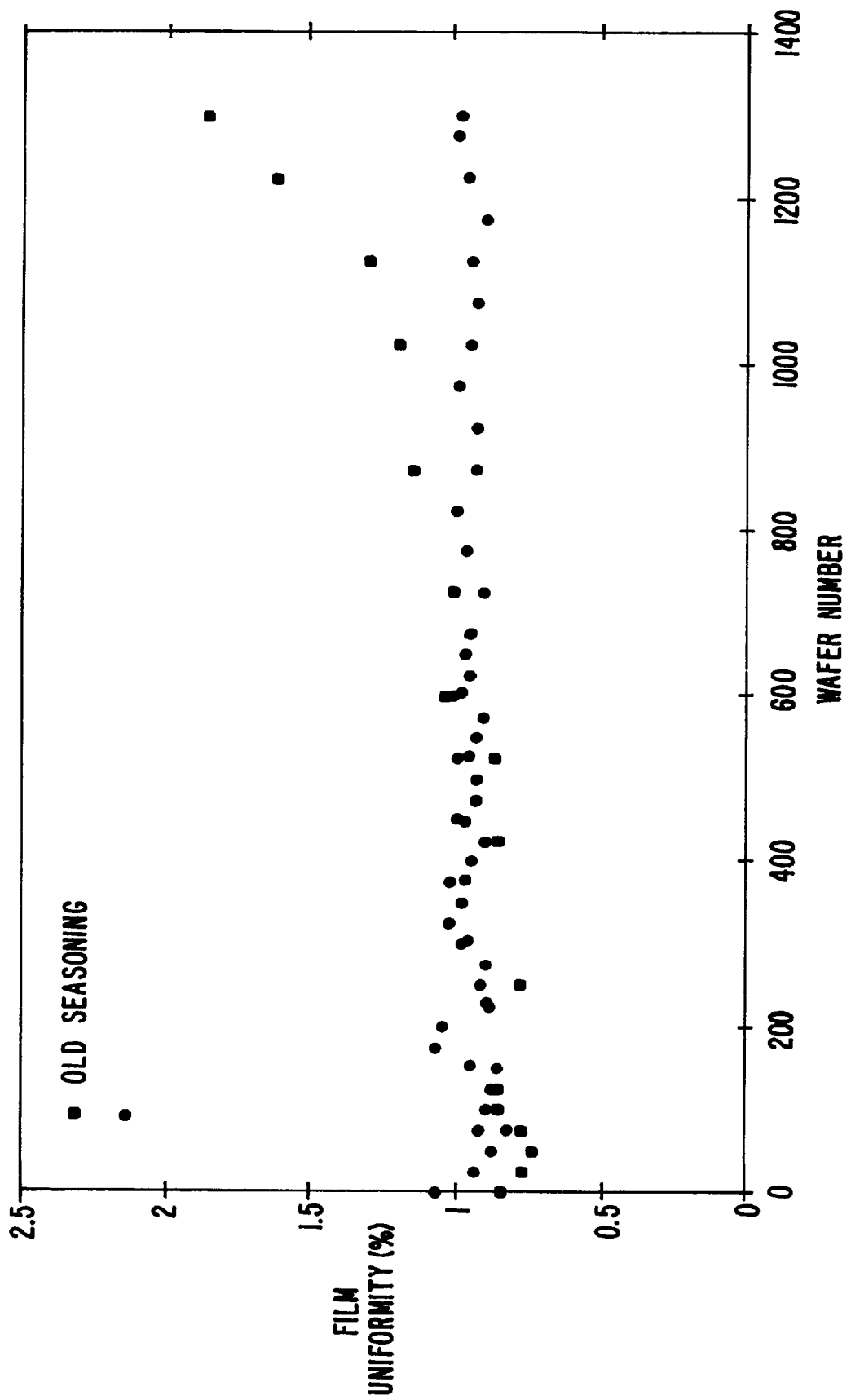
FIGS. 6 and 7 are graphs comparing film uniformity throughout extended wafer runs of layers deposited in chambers having seasoning layers deposited with and without the benefits of the present invention.

As shown in FIG. 6, after processing the first 700–800 wafers, the uniformity of films deposited in the chamber seasoned with the seasoning layer of the present invention was superior to the uniformity of films deposited with the old seasoning recipe. The difference in uniformity became increasingly noticeable as additional wafers were processed. Films deposited in the chamber seasoned with the prior seasoning recipe saw a continuing decrease in film uniformity after the 700th or 800th wafer was processed, while films deposited in the chamber seasoned with the seasoning layer of the present invention did not exhibit any discernable difference in uniformity over the entire 1300 substrate run.

Figure 7:
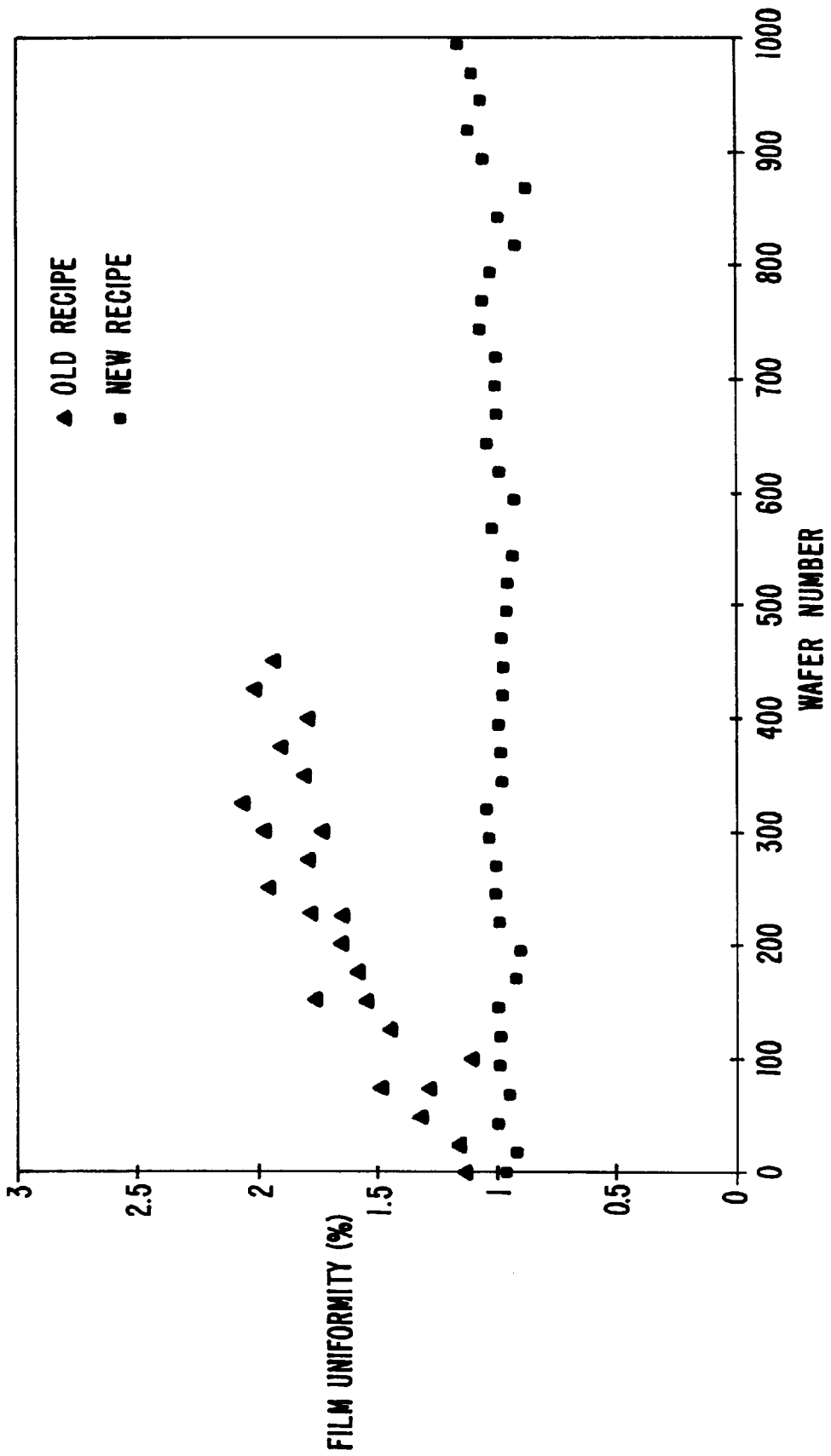

In still another experiment, a straight run of 1000 wafer was performed in which a 2.5 μm USG film was deposited over each wafer. In between wafer depositions, the chamber was cleaned for 143 seconds as described above and seasoned with the old and new seasoning layers. When the seasoning layer deposited with increased ion bombardment according to the present invention was deposited for 30 seconds, uniformity was measured to be substantially constant between the first and last wafers processed as shown in FIG. 7. For this seasoning layer TEOS was introduced at 1350 mgm, $O_2$ at 600 sccm and He at 1000 sccm. Pressure was set at 4.2 torr, temperature at 400° C, spacing at 250 mil, RF1 at 175 W and RF2 at 450 W. These processing conditions deposited the seasoning layer of the present invention at an increased deposition rate of 9000 Å/min.

In a straight run of 400 wafers that used a previous high deposition rate seasoning layer deposition process for 10 seconds, uniformity drifted after only the first few wafers. The measured uniformity for this experiment is also shown in FIG. 7. In another straight run using the same previously known high deposition rate deposition process for 20 seconds, uniformity also drifted before all 400 wafers were processed. This previously known high deposition rate seasoning process introduced TEOS into the chamber at a rate of 1800 mgm, $O_2$ at 1000 sccm and helium at 1000 sccm. Temperature was set at 400° C., pressure at 7.5 torr, spacing at 280 mils, RF1 at 900 W and RF2 at 240 W. These process conditions deposited a film at 12000 Å/min.

The parameters listed in the above process should not be limiting to the claims as described herein. One of ordinary skill in the art can also use chemicals, chamber parameters, and conditions other than those described with respect to the preferred embodiments. As such, the above description is illustrative and not restrictive. Merely by way of example, while the invention is illustrated with particular reference to a process using TEOS as a source of silicon and $O_2$ as a source of oxygen, it is possible to use other silicon sources, such as silane, and other oxygen sources, such as $N_2O$, CO or others. Additionally, while not preferred for most embodiments, it is possible to include dopants such as boron, phosphorus or others in the silicon oxide seasoning layer.

The invention is applicable to reducing contaminants that originate from cleaning operations that use etchant gases other than fluorine, and it is also possible to perform CVD operations to deposit layers other than PECVD USG layers as step 240. For example, thermal USG films, thermal or plasma enhanced FSG films and others may be deposited. The present invention can reduce contaminant levels in all such cases. The scope of the invention should, therefore, be determined not with reference to the above description, but instead should be determined with reference to the appended claims along with their full scope of equivalents.

What is claimed is:

1. A method of operating a substrate processing chamber, said method comprising:
   cleaning material deposited on at least one interior surface of said chamber by reacting said material with a fluorine-containing gas, said cleaning step leaving a residue comprising fluorine atoms on at least a portion of said at least one interior surface;
   thereafter, depositing a silicon oxide film over said at least one interior surface of said chamber by introducing a process gas comprising silicon and oxygen into said chamber, said silicon oxide film substantially covering said portion of said at least one interior surface;
   wherein conditions of said depositing step are selected so that said deposited silicon oxide film exhibits substantially no fluorine out gassing during thermal desorbtion spectra testing when heated up to 600° C. after being deposited over a test substrate placed in the chamber during said depositing step.

2. The method of claim 1 wherein said deposited silicon oxide film exhibits substantially no fluorine outgassing during thermal desorbtion spectra testing when heated up to 800° C.

3. The method of claim 1 wherein said deposited silicon oxide film exhibits substantially no fluorine outgassing during thermal desorbtion spectra testing when heated up to 1000° C.

4. The method of claim 1 wherein said silicon oxide film is deposited by striking a plasma from said process gas by application of a first RF power signal and a second RF power signal different than said first RF power signal, said first RF power signal having a frequency greater than 2 MHz and said second RF power signal having a frequency less than 2 MHz, said second RF power signal being provided at a power density level greater than 2.65 W/in$^2$.

5. The method of claim 4 wherein the power density level of said second RF power signal is greater than about 3.10 W/in$^2$.

6. The method of claim 4 wherein said process gas comprises tetraethoxysilane (TEOS) and an oxygen source.

7. The method of claim 6 wherein said plasma is formed from said oxygen source before said TEOS is intronuced into said chamber.

8. A method of operating a substrate processing chamber, said method comprising:
   cleaning material deposited on at least one interior surface of said chamber by reacting said material with a fluorine-containing gas, said cleaning step leaving a residue comprising fluorine atoms on at least a portion of said at least one interior surface;
   thereafter, depositing a silicon oxide film over said at least one interior surface of said chamber by introducing a process gas comprising silicon and oxygen into said chamber, said silicon oxide film substantially covering said portion of said at least one interior surface;
   wherein conditions of said depositing step are selected to favor formation of stable SiF bonds within said silicon oxide film so that said deposited silicon oxide film exhibits substantially no fluorine out gassing during thermal desorbtion spectra testing when heated up to 600° C. after being deposited over a test substrate placed in the chamber during said depositing step.

9. A method of fabricating one or more integrated circuits, said method comprising the steps of:
   (a) providing a substrate processing chamber having an interior surface;
   (b) cleaning at least a portion of said interior surface of said chamber by introducing a fluorine-containing gas into said chamber, said cleaning step leaving a residue comprising fluorine atoms on said at least a portion of said interior surface;
   (c) thereafter, introducing a process gas comprising silicon and oxygen into said chamber;
   (d) striking a plasma from said process gas to deposit a silicon oxide film over said at least a portion of said interior surface of said chamber, said silicon oxide film substantially covering said portion of said at least one interior surface;
   wherein deposition conditions for said silicon oxide film are set so that said deposited silicon oxide film exhibits substantially no fluorine out gassing during thermal desorbtion spectra testing when heated up to 600° C. after being deposited over a test substrate placed in the chamber during said depositing step;
   (e) thereafter, transferring a substrate upon which said one or more integrated circuits are to be formed into said chamber; and
   (f) thereafter, introducing a deposition gas into said chamber to deposit a layer over said substrate.

10. The method of claim 9 wherein said step of striking a plasma from said process gas includes the application of a first RF power signal and a second RF power signal different from said first RF power signal, said first RF power signal having a frequency greater than 2 MHz and said second RF power signal having a frequency less than 2 MHz, said second RF power signal being provided at a power density level greater than 2.65 W/in$^2$.

11. The method of claim 10 wherein the power density level of said second RF power signal is greater than about 3.10 W/in$^2$.

12. The method of claim 10 wherein said process gas comprises tetraethoxysilane (TEOS) and an oxygen source.

13. The method of claim 12 wherein said plasma is formed from said oxygen source before said TEOS is introduced into said chamber.

14. The method of claim 10 wherein said layer deposited over said substrate is a undoped silicate glass (USG) or fluorosilicate glass (FSG) layer.

15. The method of claim 14 wherein said process gas comprises tetraethoxysilane (TEOS) and a oxygen source.

16. The method of claim 10 wherein said steps (b) through (f) are repeated consecutively n times, where n is a positive integer, and wherein after each of said (f) steps said substrate having said layer deposited thereon is removed from said chamber.

17. The method of claim 16 wherein n is greater than 1000.

18. A method of fabricating one or more integrated circuits that includes depositing at least one thin film layer over each of the one or more integrated circuits in a substrate processing chamber having an interior surface, said method comprising the steps of:

(a) providing first and second substrates upon which one or more integrated circuits are to be formed, each of said first and second substrates having partially fabricated structures thereon;

(b) during a first fabrication step, introducing the first substrate upon which one or more integrated circuits is to be formed into the chamber, depositing a first thin film layer over said first substrate and at least a portion of the interior surface of the chamber and then transferring said first substrate out of the chamber;

(c) during a second fabrication step subsequent to said first step, flowing a fluorine-containing gas into the chamber to etch away at least some of said deposition material from said portion of said interior surface of the chamber thereby leaving a residue comprising fluorine atoms on said portion of the interior surface of the chamber;

(d) during a third fabrication step subsequent to said second step, (i) flowing a process gas comprising silicon-containing and oxygen-containing sources into the chamber;

(ii) forming a plasma from said process gas; and (iii) maintaining deposition conditions in the chamber to deposit a silicon oxide film over said portion of the interior surface of the chamber, said silicon oxide film substantially covering said portion of said at least one interior surface of the chamber, wherein said deposition conditions for said silicon oxide film are selected so that said deposited silicon oxide film exhibits substantially no fluorine out gassing during thermal desorbtion spectra testing when heated up to 600° C. after being deposited over a test substrate placed in the chamber during said depositing step;

(e) during a fourth fabrication step subsequent to said third step, transferring the second substrate upon which additional ones of said one or more integrated circuits are to be formed into said chamber and depositing a second thin film layer over said second substrate; and (f) performing subsequent processing steps to complete formation of the one or more integrated circuits over each of the first and second substrates.

19. The method of claim, 18 wherein said step of flowing said fluorine-containing gas lasts for between 75 and 140 seconds.

20. The method of claim 19 wherein said plasma formed from said process gas in step (d) is formed by application of a first RF power signal and a second RF power signal different from said first RF power signal, said first RF power signal having a frequency greater than 2 MHz and said second RF power signal having a frequency less than 2 MHz, said second RF power signal being provided at a power density level greater than about 3.10 W/cm$^2$.

* * * * *